(12) United States Patent
Kanaumi et al.

(10) Patent No.: US 9,786,823 B2
(45) Date of Patent: Oct. 10, 2017

(54) LIGHT-EMITTING DEVICE WITH SEALING MEMBER COMPRISING ZINC SULFIDE PARTICLES

(71) Applicant: NS Materials Inc., Chikushino-shi, Fukuoka (JP)

(72) Inventors: Eiichi Kanaumi, Chikushino (JP); Jun Kaneno, Chikushino (JP)

(73) Assignee: NS MATERIALS INC., Ryumyouji, Chikushino-Shi, Fukuoka (JP)

( * ) Notice: Subject to any disclaimer, the term of this patent is extended or adjusted under 35 U.S.C. 154(b) by 0 days.

(21) Appl. No.: 14/901,728

(22) PCT Filed: Jul. 8, 2013

(86) PCT No.: PCT/JP2013/068652
§ 371 (c)(1),
(2) Date: Dec. 29, 2015

(87) PCT Pub. No.: WO2015/004711
PCT Pub. Date: Jan. 15, 2015

(65) Prior Publication Data
US 2016/0197247 A1    Jul. 7, 2016

(51) Int. Cl.
*H01L 33/50* (2010.01)
*H01L 33/56* (2010.01)
*H01L 33/62* (2010.01)

(52) U.S. Cl.
CPC .......... *H01L 33/502* (2013.01); *H01L 33/501* (2013.01); *H01L 33/507* (2013.01);
(Continued)

(58) Field of Classification Search
CPC .................. H01L 33/502; H01L 33/504
See application file for complete search history.

(56) References Cited

U.S. PATENT DOCUMENTS 6,870,311 B2 * 3/2005 Mueller ................ H01L 33/501
257/98
8,030,843 B2 * 10/2011 Gibson ................ C09K 11/025
313/501
(Continued)

FOREIGN PATENT DOCUMENTS

EP       1 745 513 B1    11/2011
JP       2003-225900 A    8/2003
(Continued)

OTHER PUBLICATIONS

International Search Report received for International Patent Application No. PCT/JP2013/068652 mailed on Aug. 13, 2013, 6 pages (2 pages of English Translation and 4 pages of International Search Report).

(Continued)

*Primary Examiner* — Victor A Mandala
*Assistant Examiner* — Regan J Rundio
(74) *Attorney, Agent, or Firm* — East West Law Group; Heedong Chae (57) ABSTRACT

An LED light emitting device 5 as an example of a light emitting device utilizing a semiconductor to which the present invention is applied includes a package 10, a semiconductor light emitting element 200, a first sealing layer 50, and a second sealing layer 60. The semiconductor light emitting element 200 includes a p-n functioned semiconductor layer, and serves as a light source that emits light in accordance with application of a voltage to the semiconductor layer. The semiconductor light emitting element 200 is connected to power supply terminals 201 that supply a current.

13 Claims, 9 Drawing Sheets

(52) U.S. Cl.
CPC .............. *H01L 33/56* (2013.01); *H01L 33/62* (2013.01); *H01L 2224/48091* (2013.01); *H01L 2924/181* (2013.01)

(56) References Cited

U.S. PATENT DOCUMENTS

| | | | | |
|---|---|---|---|---|
| 8,547,010 | B2* | 10/2013 | Jagt | H01L 33/504 257/E33.06 |
| 8,552,448 | B2* | 10/2013 | Ichikawa | H01L 33/50 257/98 |
| 8,674,390 | B2* | 3/2014 | Harris | H01L 33/507 257/100 |
| 2004/0025634 | A1 | 2/2004 | Nakamura et al. | |
| 2007/0128350 | A1 | 6/2007 | Nakamura et al. | |
| 2008/0173886 | A1* | 7/2008 | Cheon | C09K 11/02 257/98 |
| 2011/0147778 | A1* | 6/2011 | Ichikawa | H01L 33/50 257/98 |
| 2012/0195340 | A1* | 8/2012 | Cheon | H01L 33/501 372/50.1 |
| 2013/0228812 | A1* | 9/2013 | Annen | H01L 33/504 257/98 |
| 2014/0103798 | A1* | 4/2014 | Yamanaka | H01L 33/486 313/512 |
| 2014/0339495 | A1* | 11/2014 | Bibl | H01L 33/504 257/13 |
| 2015/0108524 | A1* | 4/2015 | Pickett | B82Y 15/00 257/98 |
| 2016/0218252 | A1* | 7/2016 | Steckel | H01L 33/501 |
| 2016/0268486 | A1* | 9/2016 | Harris | H01L 33/483 |

FOREIGN PATENT DOCUMENTS

| | | |
|---|---|---|
| JP | 2007-533160 A | 11/2007 |
| JP | 2009-231510 A | 10/2009 |
| JP | 2011-142336 A | 7/2011 |
| JP | 2012-191144 A | 10/2012 |
| JP | 2013-505347 A | 2/2013 |
| WO | 99/50916 A9 | 10/1999 |
| WO | 2005/023704 A1 | 3/2005 |
| WO | 2011/036447 A1 | 3/2011 |
| WO | 2012/132236 A1 | 10/2012 |
| WO | 2013/001687 A1 | 1/2013 |

OTHER PUBLICATIONS

Comments accompanying International Search Report received for International Patent Application No. PCT/JP2013/068652, 4 pages (2 pages of English Translation and 2 pages of original comments).

* cited by examiner

LIGHT-EMITTING DEVICE WITH SEALING MEMBER COMPRISING ZINC SULFIDE PARTICLES

CROSS REFERENCE TO RELATED APPLICATIONS

This patent application is a U.S. national stage application under 35 U.S.C. §371 of International Patent Application No. PCT/JP2013/068652 filed on Jul. 8, 2013. The International Application was published in Japanese on Jan. 15, 2015, as International Publication No. WO 2015/004711 A1 under PCT Article 21(2).

TECHNICAL FIELD

The present invention relates to a light emitting device utilizing a semiconductor. In detail, the present invention relates to a light emitting device utilizing a semiconductor which has sufficient luminescence efficiency and is capable of stably emitting light for a long time.

BACKGROUND ART

An LED element (light emitting diode) is a semiconductor element that emits light by application of a voltage, and is widely used due to high brightness, long life, and a characteristic of obtaining light not containing unnecessary ultraviolet rays or infrared rays. As a use thereof, the LED element is applied to a lighting device as well as a headlight of an automobile, a backlight of an electronic device, various displays, and the like.

The light emitted from the LED element is monochromatic light of a frequency corresponding to a bandgap of a chemical compound forming a semiconductor. Therefore, since a wavelength of the emitted light is changed in accordance with the kind of chemical compound, LED elements that emit various emitting light colors are manufactured. As the chemical compound, for example, Ga (gallium), N (nitrogen), In (indium), Al (aluminum), P (phosphorus), and the like are used.

A white LED light emitting element that is widely used for a backlight for a liquid crystal device, and a lighting device, etc., is realized by combining a semiconductor light emitting element that emits blue light and green, red, and yellow fluorescent bodies, etc. The kinds of fluorescent bodies include quantum dot fluorescent bodies (hereinafter, referred to as semiconductor quantum dots) consisting of inorganic fluorescent bodies, organic fluorescent bodies, and semiconductors.

Among these fluorescent bodies, semiconductor quantum dots are very small semiconductor particles, the maximum particle diameter of which is 50 nm or less. The semiconductor quantum dots absorb photons of energy greater than a bandgap (energy difference between a valence band and a conduction band), and emit light having a wavelength corresponding to the particle diameter thereof. That is, by having a property of absorbing light of a fixed wavelength or less and controlling the particle diameter, light of various wavelengths can be generated.

A semiconductor quantum dot shows a quantum confinement effect in a region smaller than the Bohr radius of a compound semiconductor excitation, and can realize high fluorescence efficiency. Here, the fluorescence efficiency is a ratio of the number of photons of emitted fluorescent light to the number of photons of light input in the semiconductor quantum dot. Luminescence efficiency is an index of brightness that the whole of a light emitting device can generate with fixed energy.

In a light emitting device utilizing semiconductor quantum dots, part of light emitted from a light source is converted into light of a predetermined wavelength by a quantum dot fluorescent body, and the other part is emitted as it is. These two kinds of lights are mixed and recognized as white light by human vision. Under such circumstances, a technique relating to a light emitting device capable of emitting light of a desired wavelength with use of semiconductor quantum dots is proposed (for example, refer to Patent Document 1 and Patent Document 2).

On the other hand, fluorescence efficiency of semiconductor quantum dots depends on surface characteristics such as a surface structure and surface crystallinity. A semiconductor quantum dot is a particle with a very high ratio of surface area to volume since the semiconductor quantum dot has a particle size very small as several tens of nanometers. Therefore, defects easily occur on surfaces of semiconductor quantum dots.

Defects on surfaces of semiconductor quantum dots act as various energy traps existing in a bandgap, and results in deterioration of the luminescence efficiency of the whole device. In detail, dangling bonds (unsatisfied valences of atoms) on the surfaces and atomic vacancies cause an imbalance of electric charges, and excited electrons are trapped, so that fluorescence efficiency is deteriorated.

Due to the defects on the surfaces of the semiconductor quantum dots, the fluorescence efficiency deteriorates, and light from the light source becomes difficult to be wavelength-converted. As a result, the luminescence efficiency of the whole device is deteriorated. In addition, influences of various exogenous factors may cause defects on surfaces of semiconductor quantum dots. However, at present, major causes are not clearly known.

Under these circumstances, a light emitting device in which contact between oxygen and semiconductor quantum dots is reduced on the assumption that defects on surfaces of semiconductor quantum dots are mainly caused by oxidation of the surfaces due to oxygen has been proposed (for example, refer to Patent Document 3).

Figure 9:
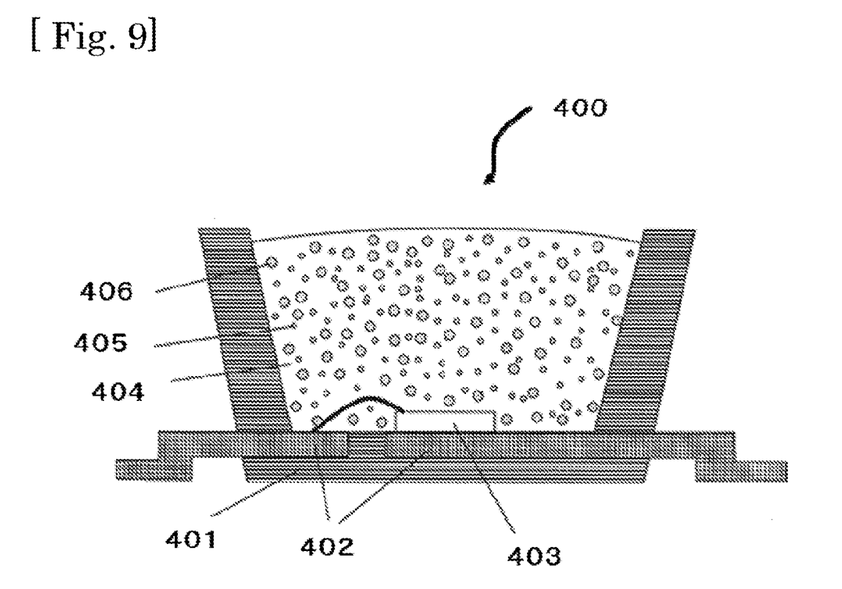
FIG. 9 A schematic view showing a conventional light emitting device utilizing semiconductor quantum dots.

In detail, Patent Document 3 describes the light emitting device 400 as shown in FIG. 9. This light emitting device 400 includes a package 401 made of a resin, a lead frame 402, and a semiconductor light emitting element 403 mounted on the lead frame.

The light emitting device 400 includes a resin portion 404 formed so as to cover the semiconductor light emitting element 403. The resin portion 404 includes semiconductor quantum dots 405 and getter particles 406 that adsorb oxygen.

In the light emitting device 400 described in Patent Document 3, the amount of oxygen that comes into contact with the surfaces of the semiconductor quantum dots 405 is reduced by adsorption of oxygen entering the resin portion 404 by the getter particles 406.

CITATION LIST

Patent Documents

Patent Document 1: Japanese Published Unexamined Patent Application No. 2011-142336
Patent Document 2: Japanese Published Unexamined Patent Application No. 2012-191144

Patent Document 3: international Publication No. 2012/132236

SUMMARY OF THE INVENTION

Problems to be Solved by the Invention

Here, the inventors supposed that the defects on the surfaces of semiconductor quantum dots were caused not by oxidation of the surfaces but by moisture in the air, and earnestly examined this. In detail, the inventors supposed that moisture in the air entered the inside of the device and came into contact with shell portions made of ZnS (zinc sulfide) of the surfaces of the semiconductor quantum dots, and the shells were dissolved or decomposed to cause the defects on the surfaces.

A semiconductor quantum dot has a structure called a core-shell type semiconductor quantum dot. This structure is obtained by coating a core serving as a light emitting portion with a shell serving as a protection film. For example, CdSe (cadmium selenide) can be used for the core, and ZnS can be used for the shell. By coating defects on the surface of the CdSe particle with ZnS with a large bandgap, the quantum yield is improved.

To confirm the cause of the deterioration of luminescence efficiency of the light emitting device, the following test was conducted. The test proved that the deterioration of luminescence efficiency of the device was caused not by oxygen but by moisture.

Figure 1:
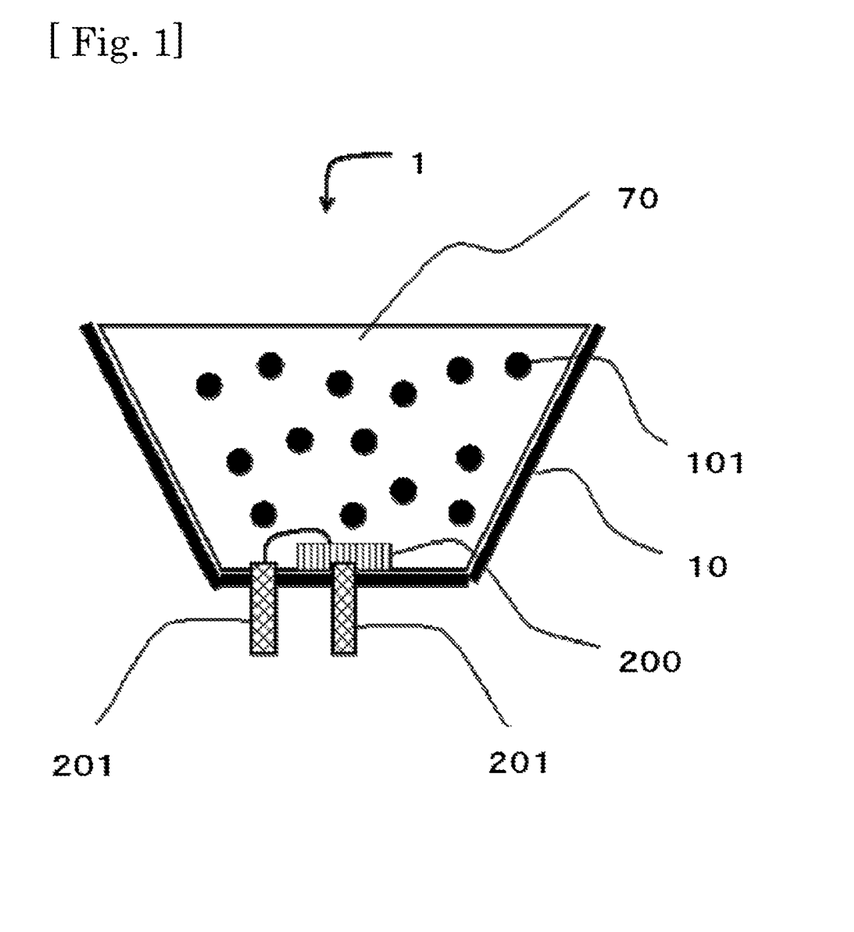
FIG. 1 A schematic view showing a structure of a light emitting device used for a test concerning humidity.
Figure 2:
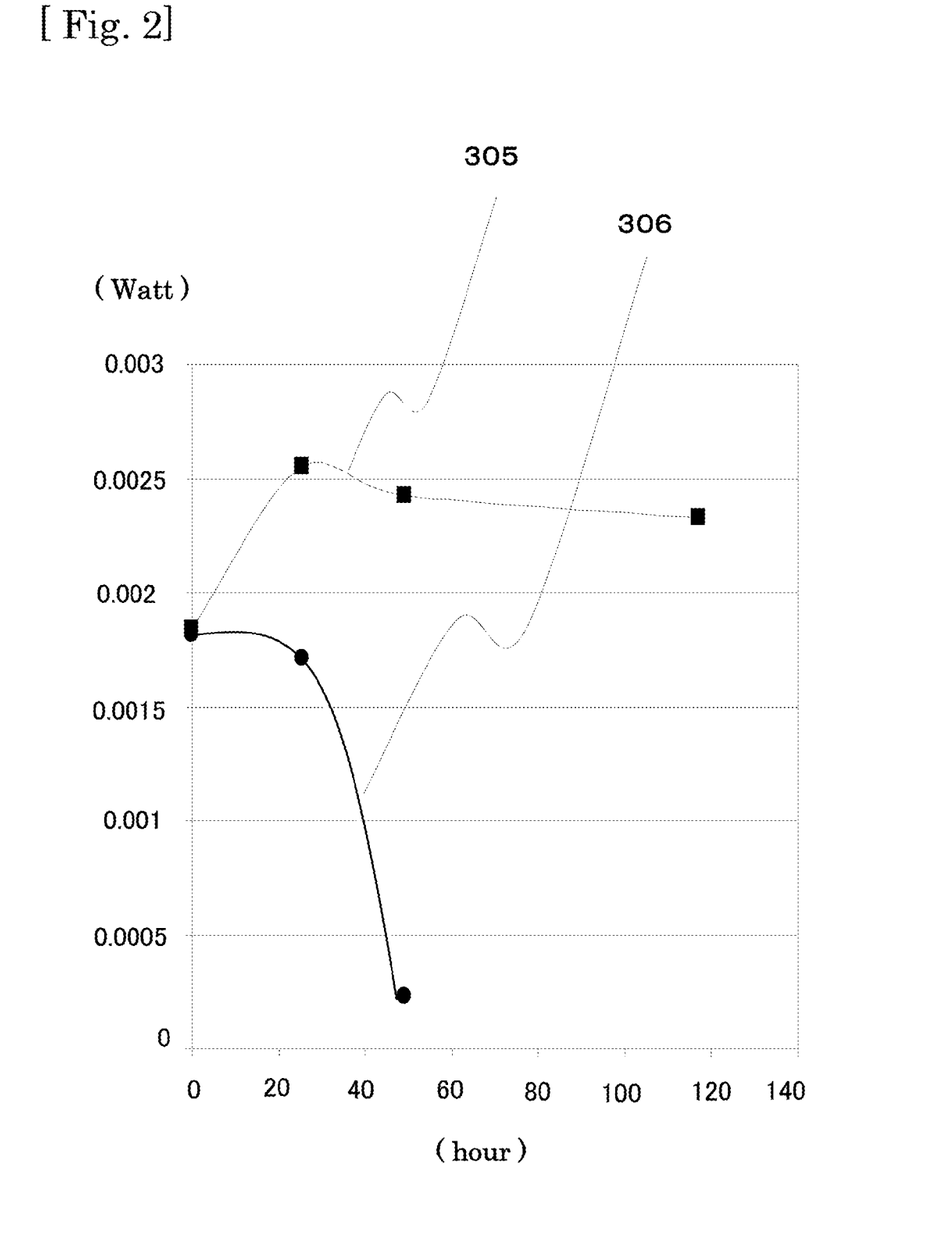
FIG. 2 A graph showing results of a luminescence lifetime test concerning humidity.

FIG. 1 is a schematic view showing a structure of a light emitting device used for the test concerning humidity. FIG. 2 is a graph showing results of the luminescence lifetime test concerning humidity. Hereinafter, the structure of the light emitting device used for the test will be described.

As shown in FIG. 1, in a light emitting device 1, a semiconductor light emitting element 200 that emits blue light is mounted on a concave portion bottom surface of a package 10. In addition, the light emitting device is structured so that semiconductor quantum dots 101 are mixed in a silicone resin 70 and filled in the package 10.

In addition, power supply terminals 201 are provided on a concave portion back surface of the package 10, and by supplying a current by applying a voltage from the power supply terminals 201, the semiconductor light emitting element 200 is made to emit light.

Hereinafter, outline of the test will be described.

By using the light emitting device 1, the luminescence lifetime test was conducted under the following conditions. Two light emitting devices 1 were prepared and left for a predetermined period of time in an endurance testing machine. One was left under a condition of a temperature of 60° C. and a humidity of 90%, and the other was left under a condition of a temperature of 60° C. without humidification.

After an elapse of the predetermined period of time from the start of the test, the light emitting devices were taken out of the endurance testing machine, and energy intensities of lights emitted from the respective devices were measured by using a total luminous flux measurement system. The results of this test are shown in FIG. 2 and Table 1. Conditions on entrance of oxygen into the device are substantially equal between the two conditions.

TABLE 1

| Sample name | Measurement time (h) | Peak area |
|---|---|---|
| 60° C. and a humidity of 90% | 0 | 0.001819778 |
|  | 25.5 | 0.001712766 |
|  | 49 | 0.000235088 |
| 60° C. without humidification | 0 | 0.001841611 |
|  | 25.5 | 0.002552288 |
|  | 49 | 0.002426160 |
|  | 117 | 0.002331711 |

FIG. 2 is a graph showing results of the luminescence lifetime test on the light emitting device 1 under the two kinds of conditions with humidification and without humidification as described above. The graphic curve 305 in FIG. 2 shows a result of the device left under the condition of a temperature of 60° C. without humidification, and the graphic curve 306 shows a result of the device left under the condition of a temperature of 60° C. and a humidity of 90%. Table 1 quantifies the results of light energy intensities that the samples showed at the respective measurement times.

As shown in FIG. 2, from the light emitting device left under the condition of a temperature of 60° C. without humidification, light with energy intensity of a predetermined value or more was emitted even after an elapse of 100 hours from the start of the test. That is, no deterioration of luminescence efficiency of the light emitting device 1 was observed.

On the other hand, with the light emitting device left under the condition of a temperature of 60° C. and a humidity of 90%, from the peak at about 20 hours after the start of the test, the light energy intensity decreased, and significant deterioration of luminescence efficiency was observed until an elapse of 49 hours after the start of the test.

In this test, according to deterioration of fluorescence efficiency of the semiconductor quantum dots 101, the luminescence efficiency of the whole light emitting device 1 deteriorated, and light energy intensity only of the light emitted from the semiconductor light emitting element 200 serving as a light source was at an extremely low value. That is, in the sample that showed low light energy intensity, defects occurred on the surfaces of the semiconductor quantum dots.

From the results of the test described above, it was made clear that luminescence efficiency of a light emitting device utilizing semiconductor quantum dots was deteriorated by humidity, that is, the existence of environmental moisture. Since there was no difference in entrance of oxygen into the inside of the device between the two kinds of conditions, it was made clear that moisture rather than oxygen greatly influenced deterioration of luminescence efficiency of a light emitting device.

It is supposed that by contact of the shell portions of the semiconductor quantum dots with environmental moisture, ZnS is dissolved or decomposed, and the cores are no longer coated, and as a result, fluorescence efficiency of the semiconductor quantum dots deteriorates.

Therefore, the light emitting device described in Patent Document 3 does not have a structure made by taking into account moisture that enters the inside of the device, so that defects easily occur on the surfaces of the semiconductor quantum dots due to moisture. As a result, it is considered that this light emitting device easily deteriorates in an environment with high humidity.

Therefore, as a light emitting device utilizing semiconductor quantum dots, a device capable of realizing a longer life by reducing contact of the surfaces of the semiconductor quantum dots with moisture is demanded.

The light emitting device is not limited to use of semiconductor quantum dots but has such a structure that a semiconductor light emitting element serving as a light source and a wire lead are covered and protected by a sealing material using resin or the like. The sealing material protects the whole semiconductor light emitting element from vibration, moisture, heat, and physical external impact.

However, there is a problem that a protection performance of the sealing material is worsened by adding a quantum dot fluorescent body and an additive for dispersing quantum dot fluorescent body particles to a resin serving as a material of the sealing material. As adverse effects on the sealing material, lowering of transparency and moisture permeability, blocking of hardening of the sealing material, and the like are found. As a result, the light emitting element is prone to breaking, and a disadvantage of shortening the luminescence lifetime of the light emitting device is generated.

The present invention has been accomplished in view of the foregoing points, and an object thereof is to provide a light emitting device utilizing a semiconductor that has sufficient luminescence efficiency and is capable of stably emitting light for a long time.

Means for Solving the Problems

In order to attain the above object, a light emitting device utilizing a semiconductor of the present invention includes a base substrate provided with a circuit pattern, a light emitting element provided on the base substrate and electrically connected to the circuit pattern, a first layer sealing portion which is formed on at least apart of the light emitting element and has semiconductor quantum dot particles, and through which light emitted from the light emitting element is transmittable, and a second layer sealing portion which is formed on at least a part of the first layer sealing portion, and has a moisture-proof property.

Here, since the base substrate is provided with a circuit pattern and the light emitting element is provided on the base substrate and electrically connected to the circuit pattern, the light emitting element serving as a light source can be provided on the base substrate.

By forming the first layer sealing portion on at least a part of the light emitting element, the light emitting element is protected, so that durability of the light emitting device utilizing the semiconductor can be improved.

By the first layer sealing portion that is formed on at least a part of the light emitting element and has semiconductor quantum dot particles, light emitted from the light emitting element can be wavelength-converted into fluorescent light in accordance with the kind of the semiconductor quantum dots. This indicates that light having a desired wavelength can be made by the configuration of the first layer sealing portion.

By the first layer sealing portion which is formed on at least a part of the light emitting element and has semiconductor quantum dot particles, and through which light emitted from the light emitting element is transmittable, light emitted from the light emitting element and fluorescent light generated from the semiconductor quantum dots can be emitted to the outside of the first layer sealing portion.

By protecting the light emitting element by the second layer sealing portion formed on at least a part of the first layer sealing portion as well, durability of the light emitting device can be further improved.

By the second layer sealing portion that is formed on at least a part of the first layer sealing portion and has a moisture-proof property, entrance of moisture into the inside of the first layer sealing portion can be reduced. That is, contact between the surfaces of the semiconductor quantum dots and moisture can be reduced.

In addition, in a case where at least one of the first layer sealing portion and the second layer sealing portion includes zinc sulfide particles, contact between the surfaces of the semiconductor quantum dots and moisture can be further reduced. That is, environmental moisture acts on both of ZnS making shells of the semiconductor quantum dots and the ZnS particles, and accordingly, contact between ZnS of the shell portions and moisture can be reduced.

In a case where the first layer sealing portion includes zinc sulfide particles, contact between the surfaces of the semiconductor quantum dots and moisture can be still further reduced. That is, since the semiconductor quantum dots and ZnS particles exist inside the same sealing portion, contact between ZnS of the shell portions and moisture can be easily suppressed.

In a case where the particle diameters of the zinc sulfide particles are smaller than the particle diameters of the semiconductor quantum dots, light emitted from the light emitting element easily strikes the semiconductor quantum dots. That is, the fluorescence efficiency of the device can be improved.

In a case where the second layer sealing portion is made of an epoxy resin or a silicone resin, the moisture-proof property of the second layer sealing portion can be further improved.

In a case where the weight ratio of the zinc sulfide particles is approximately 0.5% based on a total amount of the epoxy resin or the silicone resin, due to the existence of the ZnS particles, hardenability of the resin can be made difficult to hinder. That is, both of formation of the second layer sealing portion and provision of the moisture-proof property can be realized.

In order to attain the above-described object, a light emitting device utilizing a semiconductor according to the present invention includes a base substrate provided with a circuit pattern, a light emitting element provided on the base substrate and electrically connected to the circuit pattern, and a sealing portion which is formed on at least a part of the light emitting element and has semiconductor quantum dot particles and zinc sulfide particles, and through which light emitted from the light emitting element is transmittable.

Here, by the sealing portion having semiconductor quantum dot particles, light emitted from the light emitting element can be converted into fluorescent light in accordance with the kind of the semiconductor quantum dots.

In addition, by the sealing portion having semiconductor quantum dot particles and zinc sulfide particles, contact between the surfaces of the semiconductor quantum dots and moisture can be reduced.

Effect of the Invention

A light emitting device utilizing a semiconductor according to the present invention has sufficient luminescence efficiency, and is capable of stably emitting light for along time.

MODE FOR CARRYING OUT THE INVENTION

Hereinafter, embodiments of the present invention will be described with reference to the drawings, and the embodiments will be provided for understanding the present invention.

Figure 3:
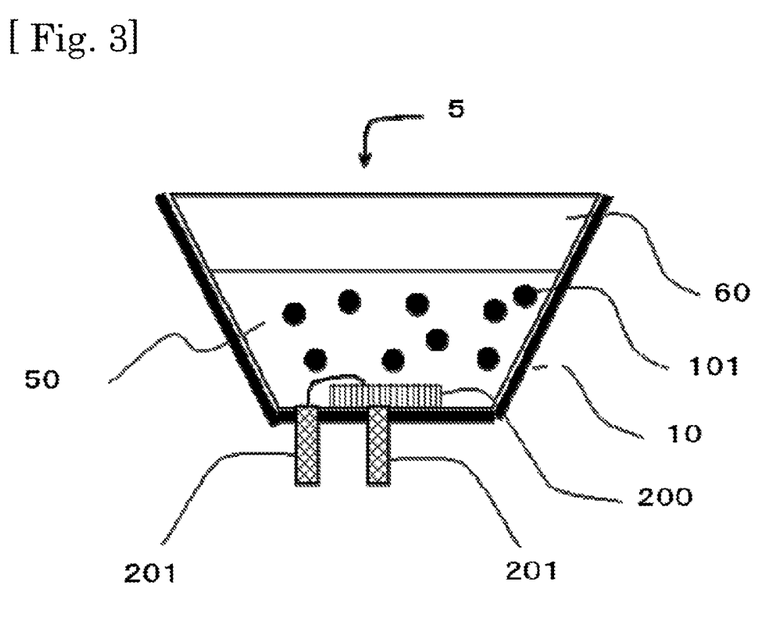
FIG. 3 A schematic view showing a structure of a first embodiment of the present invention.

FIG. 3 is a schematic view showing a structure of a first embodiment of the present invention. The first embodiment of the present invention will be described.

As shown in FIG. 3, an LED light emitting device 5 serving as one example of the light emitting device utilizing the semiconductor to which the present invention is applied includes a package 10, a semiconductor light emitting element 200, a first sealing layer 50, and a second sealing layer 60.

The semiconductor light emitting element 200 has a p-n functioned semiconductor layer, and serves as a light source that emits light according to application of a voltage to the semiconductor layer. The semiconductor light emitting element 200 is connected to power supply terminals 201 that supply a current.

On the upper portion of the semiconductor light emitting element 200, the first sealing layer 50 covers from the region of the semiconductor light emitting element 200 to the peripheral region. The first sealing layer 50 protects the semiconductor light emitting element 200.

The first sealing layer 50 is made of a silicone resin. The silicone resin includes semiconductor quantum dots 101 that generate fluorescent light by wavelength-converting light emitted from the semiconductor light emitting element 200.

The first sealing layer 50 is obtained by applying or spraying a fluorescer solution containing semiconductor quantum dots 101 to the upper surface of the semiconductor light emitting element 200 and hardening the solution. For convenience of description, the first sealing layer 50 shown in FIG. 3 is thicker than the actual layer. In actuality, the first sealing layer 50 is a thin film with a thickness of several micrometers.

The fluorescer solution is a solution containing a quantum dot fluorescent body in a hardenable medium with translucency. As the medium, for example, a photosensitive resin is used.

The first sealing layer 50 can transmit both of light derived from the light source and fluorescent light.

On the upper portion of the first sealing layer 50, a second sealing layer 60 that covers substantially the whole of the region in which the first sealing layer 50 is formed. The second sealing layer 60 also has a function to protect the semiconductor light emitting element 200 by reducing entrance of moisture into the first sealing layer 50. The second sealing layer 60 is made of an epoxy resin highly effective in moisture-proofing.

The second sealing layer 60 can transmit both of light derived from the light source and fluorescent light.

The package 10 has a shape enclosing the bottom surface of the semiconductor light emitting element 200, the first sealing layer 50, and the second sealing layer 60. The package 10 is made of plastic.

Here, the first sealing layer 50 does not necessarily have to cover the peripheral region of the upper portion of the semiconductor light emitting element 200. The first sealing layer 50 is only required to be partially formed so as to cover the semiconductor light emitting element 200. However, from the point that the semiconductor light emitting element 200 and the wire connected to the power supply terminal 201 are sufficiently protected from vibration and heat, etc., it is preferable that, on the upper portion of the semiconductor light emitting element 200, the first sealing layer 50 covers from the region of the semiconductor light emitting element 200 to the peripheral region.

The first sealing layer 50 does not necessarily have to be made of a silicone resin. However, the first sealing layer 50 is preferably made of a silicone resin from the point that the silicone resin has excellent light transmissivity and moisture-proof property.

The first sealing layer 50 does not necessarily have to be formed by applying or spraying the fluorescer solution containing semiconductor quantum dots 101 to the upper surface of the semiconductor light emitting element 200 and hardening the solution. For example, a method in which the fluorescer solution is dispersed in a solution of a silicone resin to form the first sealing layer can also be adopted.

The second sealing layer 60 does not necessarily have to be formed so as to cover substantially the whole of the region in which the first sealing layer 50 is formed, and may be partially formed. However, a second sealing layer 60 that covers substantially the whole of the region in which the first sealing layer 50 is formed is preferably formed from the point that entrance of moisture into the first sealing layer 50 can be sufficiently reduced.

The second sealing layer 60 does not necessarily have to be made of an epoxy resin. However, the second sealing layer 60 is preferably made of an epoxy resin from the point that the epoxy resin has excellent light transmissivity and moisture-proof property. In particular, the epoxy resin has properties of low water steam permeability as compared with the silicone resin, and therefore, an excellent moisture-proof property can be provided for the device.

The package 10 does not necessarily have to be made of plastic, and is only required to be made of a material with insulation properties.

In the embodiments of the present invention, as the semiconductor quantum dots 101, core-shell type semiconductor quantum dots are used. The core-shell type semiconductor quantum dot has a structure in which a core serving as a light emitting portion is doubly coated with a first shell and a second shell serving as protection films.

The core is made of CdSe (cadmium selenide), the first shell is made of ZnSe (zinc selenide), and the second shell is made of ZnS (zinc sulfide). In an interface between CdSe and ZnS, a ZnSe layer having a lattice constant in the middle between the both is epitaxially sandwiched. As another example, CdS (cadmium sulfide), ZnSe, ZnCdSe solid solution, CdSeS solid solution, or ZnCdSeS solid solution is used for the core, CdS, ZnCdS solid solution, or ZnS is used as the first shell, and ZnCdS solid solution or ZnS is used as the second shell, and according to circumstances, ZnS is used as a third shell so as to form a four-layer structure.

The structure of the core-shell type semiconductor quantum dot is not limited to the structure in which the core is doubly coated by the shells but a structure in which the core is coated by one layer of a shell or coated by three layers of shells may be used. The materials of the core, the first shell, and the second she' are not necessarily limited to CdSe, ZnSe, and ZnS. However, from the point that distortion due to mismatch of lattice between CdSe and ZnS is eased by the existence of ZnSe and a physical property of the semiconductor quantum dot is improved, the core is preferably coated by two layers of the shells.

The semiconductor quantum dots 101 are semiconductor particles with particle diameters of 50 nm or less. Here, "semiconductor particles with particle diameters of 50 nm or less" means that, when the particle diameter distribution is measured, most of quantum dots to be used, for example, 90% or more of particles in terms of a weight ratio have particle diameters of 50 nm or less. As a particle diameter distribution measuring method used in this case, the dynamic light scattering method (JIS Z8826, ISO 13321, ISO 22412) can be used.

As the semiconductor quantum dots 101, a plurality of kinds of semiconductor quantum dots can be used as necessary. The quantity to be dispersed into the fluorescent layers is also not limited. However, in a case where a white LED is made, it is preferable that the semiconductor light emitting element 200 is formed of a blue LED chip, and the semiconductor quantum dots that emit fluorescent light of 660 nm (red) and 520 nm (green) are used.

In addition, by adjusting the quantity and kinds of the semiconductor quantum dots 101, LED light emitting devices with various emission spectra can be stably manufactured. Since the semiconductor quantum dots have particle sizes smaller than those of conventional fluorescent bodies, the quantity and dispersed state hardly vary, and therefore, optical properties of light emitted from the semiconductor light emitting element can be stabilized.

In the first embodiment of the present invention, by protecting the first sealing layer 50 including the semiconductor quantum dots 101 by the second sealing layer 60 with a moisture-proof property, a structure in which moisture such as environmental humidity hardly enters the first sealing layer 50 is obtained.

That is, even in a case where the LED light emitting device 5 is installed in an environment with high humidity, defects hardly occur on the surfaces of the semiconductor quantum dots. In addition, by the two-layer structure including the first sealing layer 50 and the second sealing layer 60, the semiconductor light emitting element can be protected from external factors such as heat and vibration. As a result, the LED light emitting device 5 can be made as a device having high luminescence efficiency and a long luminescence lifetime.

Subsequently, a second embodiment of the present invention will be described.

Figure 4:
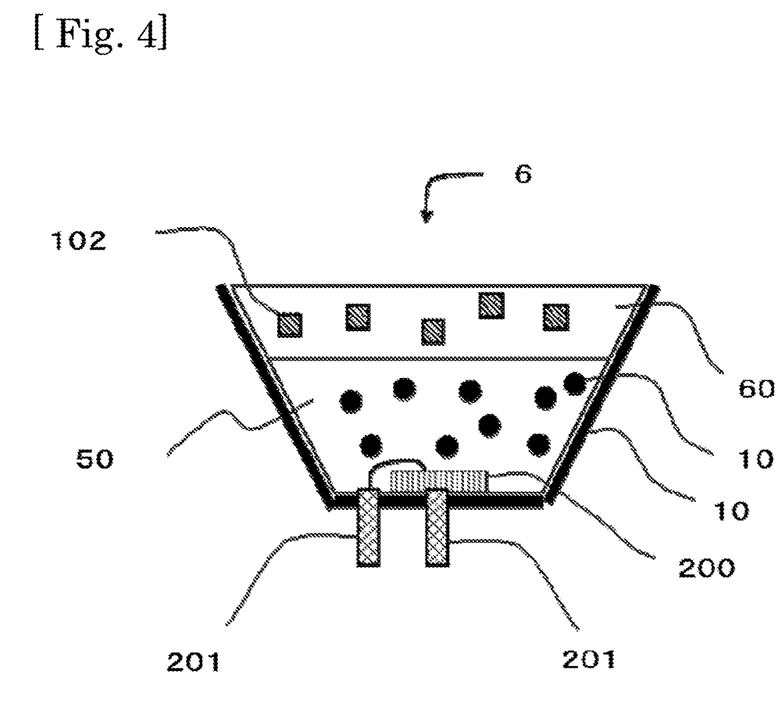
FIG. 4 A schematic view showing a structure of a second embodiment of the present invention.

FIG. 4 is a schematic view showing a structure of the second embodiment of the present invention.

As shown in FIG. 4, the LED light emitting device 6 includes a package 10, a semiconductor light emitting element 200, a first sealing layer 50, and a second sealing layer 60. The first sealing layer 50 includes semiconductor quantum dots 101. Here, detailed description of members common with the first embodiment is omitted.

The LED light emitting device 6 includes zinc sulfide (ZnS) particles 102 in the second sealing layer 60. The ZnS particles 102 react with moisture derived from environmental humidity, etc., that enters the inside of the LED light emitting device 6 to reduce dissolution of ZnS of the shell portions of the semiconductor quantum dots 101 by moisture.

The ZnS particles 102 are blended so as to reach a concentration of approximately 0.5 percent by mass (wt %) in a mixed state with an epoxy resin that forms the second sealing layer 60. The particle diameters of ZnS to be added as the ZnS particles 102 are approximately 3 nm.

Here, the second sealing layer 60 does not necessarily have to include the ZnS particles 102. However, from the point that moisture entering the inside of the LED light emitting device 6 reacts with the ZnS particles 102 and, accordingly, defects hardly occur on the surfaces of the semiconductor quantum dots 101, the second sealing layer 60 preferably includes the zinc sulfide (ZnS) particles 102.

The location in which the zinc sulfide (ZnS) particles 102 are included is not necessarily limited to the second sealing layer 60. For example, a structure in which the ZnS particles are included in the first sealing layer 50 can also be adopted. It is also possible that the ZnS particles 102 are included in both of the first sealing layer 50 and the second sealing layer 60 so that entrance of moisture is reduced by both two layers. By including ZnS particles in the two layers, moisture can be more efficiently captured.

The LED light emitting device 6 is not necessarily limited to the two-layer structure consisting of the first sealing layer 50 and the second sealing layer 60. For example, it is also possible that by adopting a structure such as a three-layer or four-layer structure obtained by further laminating a layer(s) on the second sealing layer 60, the moisture-proof effect is improved. However, by taking into account a loss of light emitted from the device, the structure is preferably determined in balance with the moisture-proof effect.

The ZnS particles 102 do not necessarily have to be blended so as to reach a concentration of approximately 0.5 percent by mass (wt %) in a mixed state with an epoxy resin that forms the second sealing layer 60. However, from the point that the concentration (of ZnS particles in the resin) is in a range in which the resin blended with ZnS is hardenable and the point that contact between ZnS of the shell portions and moisture can be sufficiently reduced, the ZnS particles 102 are preferably blended so as to reach a concentration of approximately 0.5 percent by mass (wt %) in a mixed state with an epoxy resin that forms the second sealing layer 60.

If the concentration in terms of percent by mass of the ZnS particles in the resin exceeds 2%, the resin cannot be hardened and it becomes difficult to form the sealing layer. On the other hand, if the concentration in terms of percent by mass of the ZnS particles in the resin is less than 0.1%, there is a possibility that the action of moisture on ZnS of the shell portions cannot be sufficiently reduced, and defects will easily occur on the surfaces of the semiconductor quantum dots.

The particle diameters of ZnS to be added as the ZnS particles 102 are not necessarily limited to approximately 3 nm. However, from the point that light from the light source easily strikes the semiconductor quantum dots and the fluorescence efficiency of the LED light emitting device 6 is improved, as the particle diameters of ZnS to be added, particle diameters smaller than the particle diameters of the semiconductor quantum dots are preferably adopted.

In detail, when particle diameter distributions of the semiconductor quantum dots 101 and the ZnS particles 102 are measured, the median value of the particle diameters of the ZnS particles 102 is preferably smaller than that of the particles of the semiconductor quantum dots 101. From this viewpoint, the median value of the diameters of the ZnS particles 102 is preferably 20 nm or less.

In the second embodiment of the present invention, by protecting the first sealing layer 50 including the semiconductor quantum dots 101 by the second sealing layer 60 with a moisture-proof property, a structure in which moisture such as environmental humidity hardly enters the first sealing layer 50 is obtained.

Since the second sealing layer 60 includes ZnS particles 102, moisture that entered the inside of the LED light emitting device 6 reacts with the ZnS particles 102, and accordingly, defects hardly occur on the surfaces of the semiconductor quantum dots 101. That is, by sufficiently protecting the LED light emitting device 6 from influences of moisture, the LED light emitting device 6 can be made as a device having high luminescence efficiency and a long luminescence lifetime.

Subsequently, a third embodiment of the present invention will be described.

Figure 5:
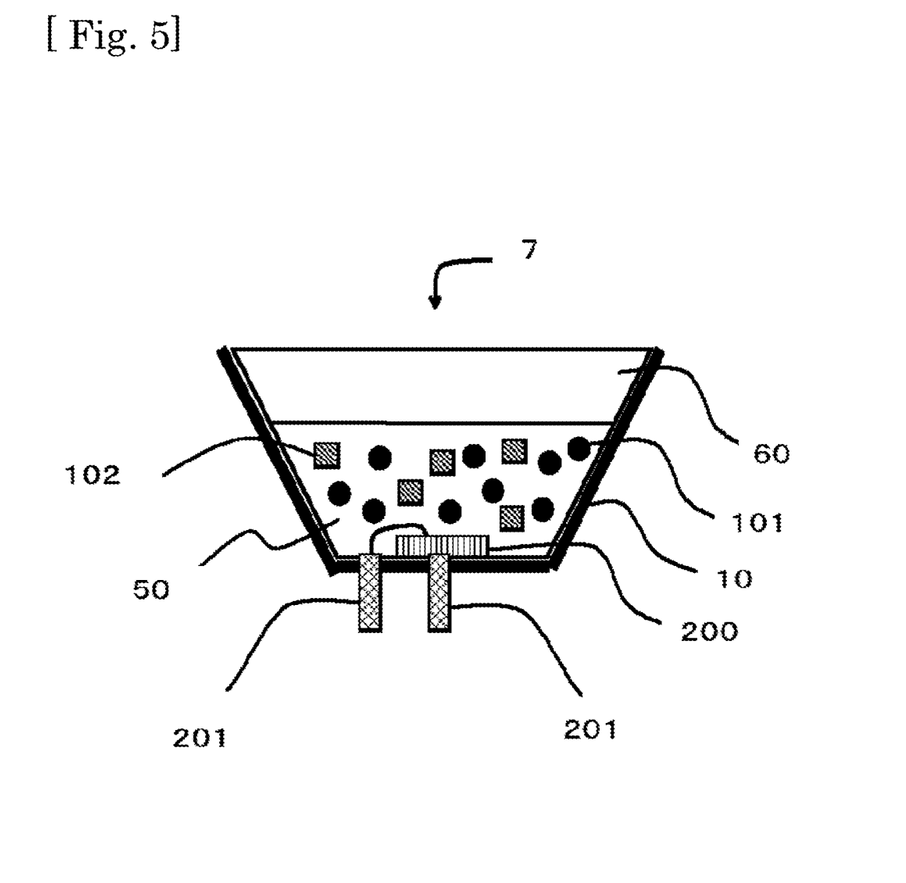
FIG. 5 A schematic view showing a structure of a third embodiment of the present invention.

FIG. 5 is a schematic view showing a structure of the third embodiment of the present invention.

As shown in FIG. 5, the LED light emitting device 7 includes a package 10, a semiconductor light emitting element 200, a first sealing layer 50, and a second sealing layer 60. In the first sealing layer 50, semiconductor quantum dots 101 are included. Here, detailed description of members common with the first embodiment and the second embodiment is omitted.

The LED light emitting device 7 includes ZnS particles 102 in the first sealing layer 50. The ZnS particles 102 react with moisture derived from environmental humidity, etc., entering the inside of the LED light emitting device 7, and reduce dissolution of ZnS of the shell portions of the semiconductor quantum dots 101 by moisture.

The ZnS particles 102 are blended so as to reach a concentration of approximately 0.5 percent by mass (wt %) in a mixed state with a silicone resin that forms the first sealing layer 50. The particle diameters of ZnS to be added as the ZnS particles 102 are approximately 3 nm.

In the third embodiment of the present invention, by protecting the first sealing layer 50 including the semiconductor quantum dots 101 by the second sealing layer 60 with a moisture-proof property, a structure in which moisture such as environmental humidity hardly enters the first sealing layer 50 is obtained.

In addition, since the ZnS particles 102 are included in the first sealing layer 50, moisture that entered the inside of the LED light emitting device 7 reacts with the ZnS particles 102, and accordingly, defects hardly occur on the surfaces of the semiconductor quantum dots 101.

Due to the existence of both of the semiconductor quantum dots 101 and the ZnS particles 102 in the first sealing layer 50, contact between ZnS of the shell portions and moisture can be easily suppressed. Therefore, by sufficiently protecting the LED light emitting device 7 from influences of moisture, the LED light emitting device 7 can be made as a device having high luminescence efficiency and a long luminescence lifetime.

Subsequently, a manufacturing method of an embodiment of the present invention will be described.

First, as the semiconductor light emitting element 200, plural elements formed on a wafer are separated and used. As the semiconductor material of the semiconductor light emitting element 200, GaN (gallium nitride), $Al_2O_3$ (sapphire), SiC (silicon carbide), and GaAs (gallium arsenide) can be used. The wafer is formed by letting N type and P type crystal layers grow on a substrate using these semiconductor materials. As a method of letting the crystals grow, liquid phase epitaxial growth in which growth is developed with use of a temperature difference in a liquid phase, or the like can be used. A commercially available wafer may be used.

The arrangement structure of the semiconductor light emitting element 200 and the power supply terminals 201 on the package 10 can be manufactured according to a known manufacturing method for a printed substrate. On a plastic substrate, a lead electrode made of aluminum and processed into an electrode shape is arranged to form a circuit pattern.

On the electrode, heated silver paste is applied, and the semiconductor light emitting element 200 is arranged on the paste and fixed onto the electrode. By wire-bonding the lead electrode and the semiconductor light emitting element 200, a voltage becomes applicable to the semiconductor light emitting element 200. Through these steps, a circuit substrate including an LED chip is completed.

Next, by using the first sealing layer 50, the above-described circuit substrate is sealed. The first sealing layer 50 is made of a silicone resin transmissive to light emitted from the semiconductor light emitting element 200. Sealing is made by a potting method, and as the silicone resin, thermosetting liquid silicone resin is used.

The method of sealing with resin is not limited to the potting method but any method may be used as long as sealing can be made. Hardening of the resin is not limited to thermal hardening but any method may be used as long as hardening can be made. For example, ultraviolet curable resin may be used. The above points are applied not only to the first sealing layer 50 but also to the second sealing layer 60.

First, the liquid silicone resin is dropped from an upper portion of the semiconductor light emitting element 200. A syringe filled with the silicone resin is used for dropping, and the resin is dropped from a leading end part of a needle provided in the syringe. A charging quantity of the resin is appropriately selected so that the first sealing layer 50 has a desired thickness. Usually, a holding portion is formed and the resin is dropped to a surrounded space.

Next, the substrate in a state where the silicone resin is dropped is heated and the resin is hardened. A heater is used for hardening the resin and heating can be made by a far-infrared heater or an IH heater. The hardened silicone resin serves as a protection layer of the semiconductor light emitting element 200.

Then, the fluorescer solution containing the semiconductor quantum dots 101 is applied to the upper surface of the semiconductor light emitting element 200 in the first sealing layer 50.

The semiconductor quantum dots 101 contained in the fluorescer solution are core-shell type semiconductor quantum dots. The core-shell type semiconductor quantum dots can be manufactured by, for example, the methods described in Japanese Published Unexamined Patent Application No. 2003-225900 and Japanese Patent Application No. WO2005/023704. A solution containing materials such as Cd and Zn passes through the interior of a heated micro flow passage so as to form nuclear particles and a coating structure. By such a manufacturing method using a microreactor, the core-shell type semiconductor quantum dots are obtained.

The core-shell type semiconductor quantum dots are dispersed into a volatile solvent after refinement and concentration adjustment, and accordingly, the fluorescer solution is obtained. In a case where the fluorescer solution is prepared, according to need, surface treatment is performed with use of phosphine and amine compounds and fluorine and silicone resin monomers and polymers and the like. Thereby, the physical property and durability of the semiconductor quantum dots are improved.

Next, by using the second sealing layer 60, the semiconductor light emitting element 200 and the first sealing layer 50 are sealed. The second sealing layer 60 is made of an epoxy resin transmissive to light emitted from the semiconductor light emitting element 200 and fluorescent light generated from the semiconductor quantum dots 101. The epoxy resin has an excellent moisture-proof property.

Sealing is made by a potting method, and as the epoxy resin, thermosetting liquid epoxy resin is used. The steps to hardening of the second sealing layer 60 are performed similarly to those of the first sealing layer 50.

Arrangement of the ZnS particles 102 differs between the second embodiment and the third embodiment. In the second embodiment, the ZnS particles 102 are dispersed in toluene and mixed with the epoxy resin that forms the second sealing layer 60 and is before being hardened. The concentration in terms of percent by mass (wt %) of the ZnS particles in toluene is 10%, and the concentration in terms of percent by mass of the ZnS particles in a mixed state with the epoxy resin is approximately 0.5%.

In the third embodiment, the ZnS particles 102 are dispersed in toluene and added to the quantum dot fluorescent dispersion liquid, and further mixed with the silicone resin that forms the first sealing layer 50 and is before being hardened. The concentration in terms of percent by mass (wt %) of the ZnS particles in toluene is 10%, and the concentration in terms of percent by mass of the ZnS particles in a mixed state with the silicone resin is approximately 0.5%.

Through the steps described above, the devices of the first to third embodiments of the present invention can be manufactured.

Subsequently, examples of the first to third embodiments of the present invention will be described.

(1) Preparation of Samples for Luminescence Lifetime Measurement Test

According to the first to third embodiments of the present invention, LED light emitting devices were prepared by the above-described manufacturing method. That is, the LED light emitting devices (without ZnS particles), the LED light emitting device 6 (including the ZnS particles 102 in the second sealing layer 60), and the LED light emitting device 7 (including the ZnS particles 102 in the first sealing layer 50) were manufactured.

(2) Luminescence Lifetime Measuring Method

Figure 6:
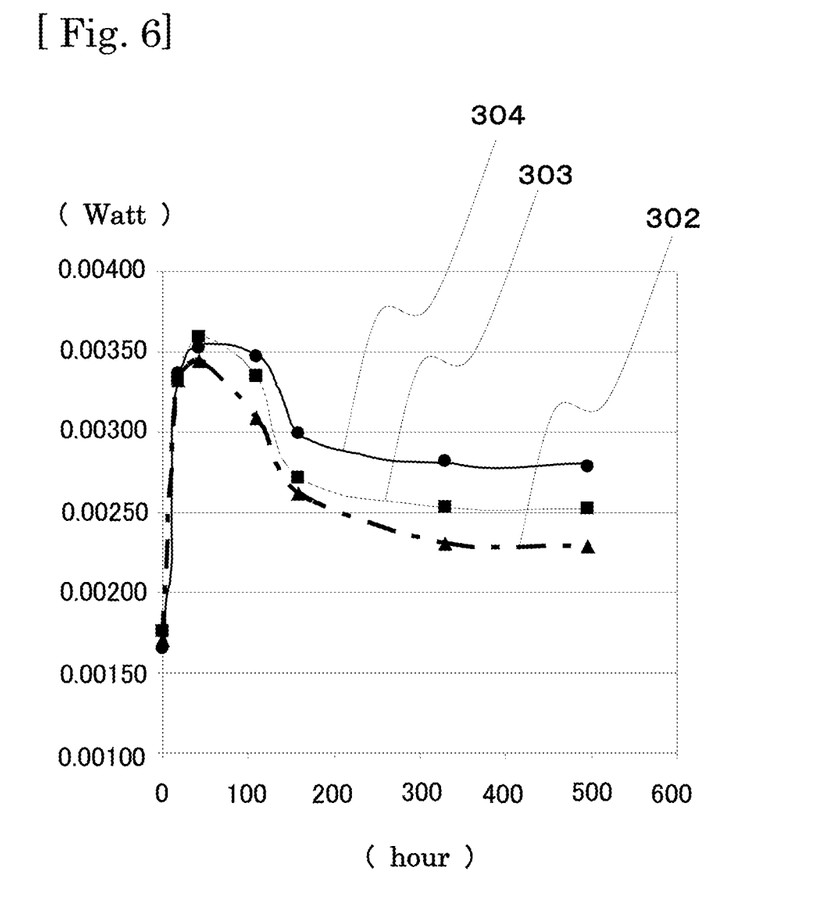
FIG. 6 A graph showing results of a luminescence lifetime test.

FIG. 6 is a graph showing results of a luminescence lifetime measurement test.

To investigate the luminescence lifetimes of the respective LED light emitting devices, the luminescence lifetimes of the samples prepared as described above were measured. Each LED light emitting device was placed inside an endurance testing machine (Cool Thermo Unit CTU-N manufactured by TAITEC CORPORATION) set to 60° C. Each LED light emitting device was taken out and the emission intensity was measured with a total luminous flux measurement system (manufactured by Otsuka Electronics Co., Ltd.) at predetermined time intervals.

In the graph shown in FIG. 6, the horizontal axis shows the elapsed time (hour) from the start of the test, and the vertical axis shows the emission energy output (Watt) emitted by the device. In FIG. 6, the graphic curve 302 is of the LED light emitting device 5 (without ZnS particles) according to the first embodiment, the graphic curve 303 is of the LED light emitting device 6 (including the ZnS particles 102 in the second sealing layer 60) according to the second embodiment, and the graphic curve 304 is of the LED light emitting device 7 (including the ZnS particles 102 in the first sealing layer 50) according to the third embodiment.

As shown in FIG. 6, the results were that the luminescence lifetimes of the LED light emitting device 7 (including the ZnS particles 102 in the first sealing layer 50), the LED light emitting device 6 (including the ZnS particles 102 in the second sealing layer 60), and the LED light emitting device 5 (without ZnS particles) decreased in this order.

FIG. 6 shows the results that the LED devices including ZnS particles 102 had longer luminescence lifetimes. FIG. 6 also shows the results that the LED device including the ZnS particles in the first sealing layer 50 had a longer luminescence lifetime.

(3) Resin Hardenability Test

To investigate the relationship between hardenability of the resin that forms the sealing layer of the present invention and the blending amount of the ZnS particles, a hardenability test was conducted. The above-described fluorescer solution was concentrated with a vacuum pump, and mixed with the ZnS particles 102 and toluene. Further, by mixing the silicone resin before being hardening and the toluene-dispersed liquid, sample solutions were obtained. The samples were prepared so that the concentration in terms of percent by mass (wt %) of the ZnS particles 102 in the silicone resin reached 0.5% and 2.0%. The sample solutions were pipetted and subjected to a hardening process, and the states of hardening of the samples were observed by using tweezers.

The sample including the ZnS particles 102 at a concentration of 0.5% in terms of percent by mass was hard when the resin was poked with tweezers, so that a hardened state of the sample could be confirmed. On the other hand, the sample including the ZnS particles 102 at a concentration of 2.0% in terms of percent by mass was soft when the resin was poked with tweezers and was stringy when taken up, so that hardening of the sample could not be confirmed.

Subsequently, a fourth embodiment of the present invention will be described.

Figure 7:
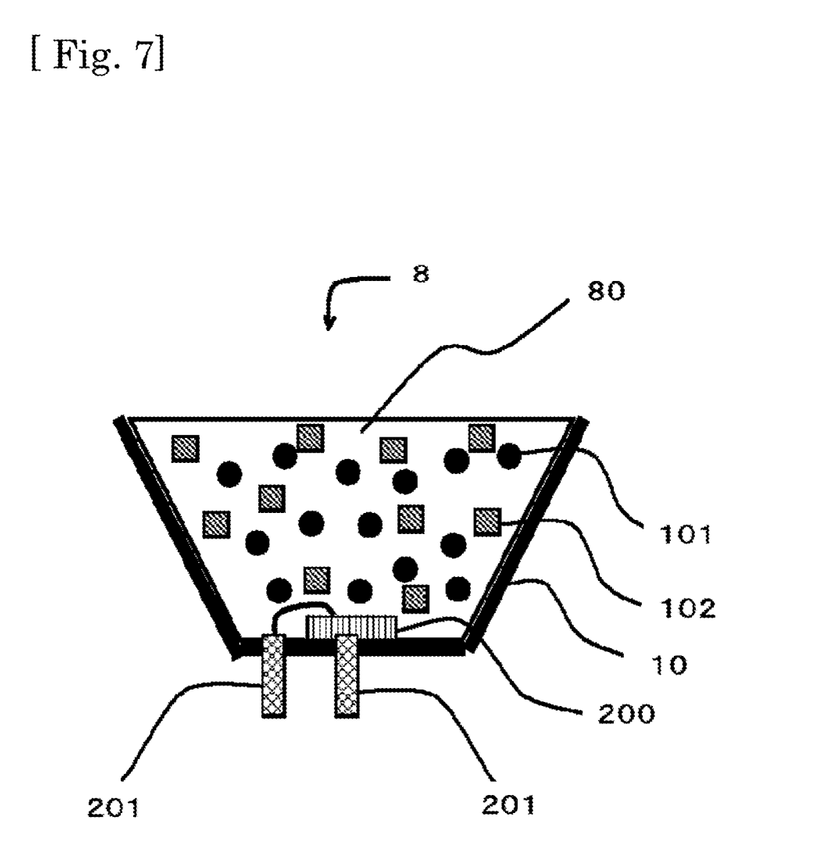
FIG. 7 A schematic view showing a structure of a fourth embodiment of the present invention.

FIG. 7 is a schematic view showing a structure of the fourth embodiment of the present invention.

As shown in FIG. 7, an LED light emitting device 8 as an example of the light emitting device utilizing the semiconductor to which the present invention is applied includes a package 10, a semiconductor light emitting element 200, and a sealing layer 80.

The semiconductor light emitting element 200 has a p-n functioned semiconductor layer, and serves as a light source that emits light by application of a voltage to the semiconductor layer. The semiconductor light emitting element 200 is connected to power supply terminals 201 that supply a current.

On the upper portion of the semiconductor light emitting element 200, the sealing layer 80 covers from the region of the semiconductor light emitting element 200 to the peripheral region. The sealing layer 80 protects the semiconductor light emitting element 200.

The sealing layer 80 is made of a silicone resin. The silicone resin includes semiconductor quantum dots 101 that wavelength-convert light emitted from the semiconductor light emitting element 200 to generate fluorescent light.

The sealing layer 80 is obtained by applying or spraying a fluorescer solution containing the semiconductor quantum dots 101 to the upper surface of the semiconductor light emitting element 200 and hardening the solution. For convenience of description, the sealing layer 80 shown in FIG.

7 is thicker than the actual layer. In actuality, the sealing layer 80 is a thin film with a thickness of several micrometers.

The fluorescer solution contains a quantum dot fluorescent body in a hardenable medium with translucency. As the medium, for example, a photosensitive resin is used. The sealing layer 80 can transmit both of light derived from the light source and fluorescent light.

Here, the sealing layer 80 does not necessarily have to cover the peripheral region of the upper portion of the semiconductor light emitting element 200. The sealing layer 80 is only required to be partially formed so as to cover the semiconductor light emitting element 200. However, from the viewpoint of sufficient protection of the semiconductor light emitting element 200 and the wire connected to the power supply terminals 201 from vibration and heat, it is preferable that, on the upper portion of the semiconductor light emitting element 200, the sealing layer 80 covers from the region of the semiconductor light emitting element 200 to the peripheral region.

The sealing layer 80 does not necessarily have to be made of a silicone resin. However, the sealing layer 80 is preferably made of a silicone resin from the point that the silicone resin has excellent light transmissivity and moisture-proof property.

The sealing layer 80 does not necessarily have to be formed by applying or spraying the fluorescer solution containing semiconductor quantum dots 101 to the upper surface of the semiconductor light emitting element 200 and hardening the solution. For example, a method in which the fluorescer solution is dispersed in a solution of a silicone resin to form the sealing layer can also be adopted.

The package 10 does not necessarily have to be made of plastic, and is only required to be made of a material with insulation properties.

In the embodiment of the present invention, as the semiconductor quantum dots 101, core-shell type semiconductor quantum dots are used. The configuration of the semiconductor quantum dots is the same as in the first embodiment, so that description thereof is omitted.

The LED light emitting device 8 includes ZnS particles 102 in the sealing layer 80. The ZnS particles 102 react with moisture derived from environmental humidity, etc., that enters the inside of the LED light emitting device 8 to reduce dissolution of ZnS of the shell portions of the semiconductor quantum dots 101 by moisture.

The ZnS particles 102 are blended so as to reach a concentration of approximately 0.5% (wt %) in terms of percent by mass in a mixed state with the silicone resin that forms the sealing layer 80. The particle diameters of ZnS to be added as the ZnS particles 102 are approximately 3 nm.

In the fourth embodiment of the present invention, since the ZnS particles 102 are included in the sealing layer 80, moisture that entered the inside of the LED light emitting device 8 reacts with the ZnS particles 102, and accordingly, defects hardly occur on the surfaces of the semiconductor quantum dots 101.

Due to the existence of both of the semiconductor quantum dots 101 and the ZnS particles 102 in the sealing layer 80, contact of ZnS of the shell portions with moisture can be easily suppressed. Therefore, by sufficiently protecting the LED light emitting device 8 from influences of moisture, the LED light emitting device 8 can be made as a device having high luminescence efficiency and a long luminescence lifetime.

Hereinafter, an example of the fourth embodiment of the present invention will be described.

(4) Preparation of Samples for Luminescence Lifetime Measurement Test

Based on the above-described manufacturing method, a LED light emitting device 8 (with ZnS particles) according to the fourth embodiment was prepared as an example, and an LED light emitting device 9 (without ZnS particles, not shown) that had a structure similar to that of the LED light emitting device 8 except that the ZnS particles 102 were not included was prepared as a comparative example.

(5) Luminescence Lifetime Measuring Method

Figure 8:
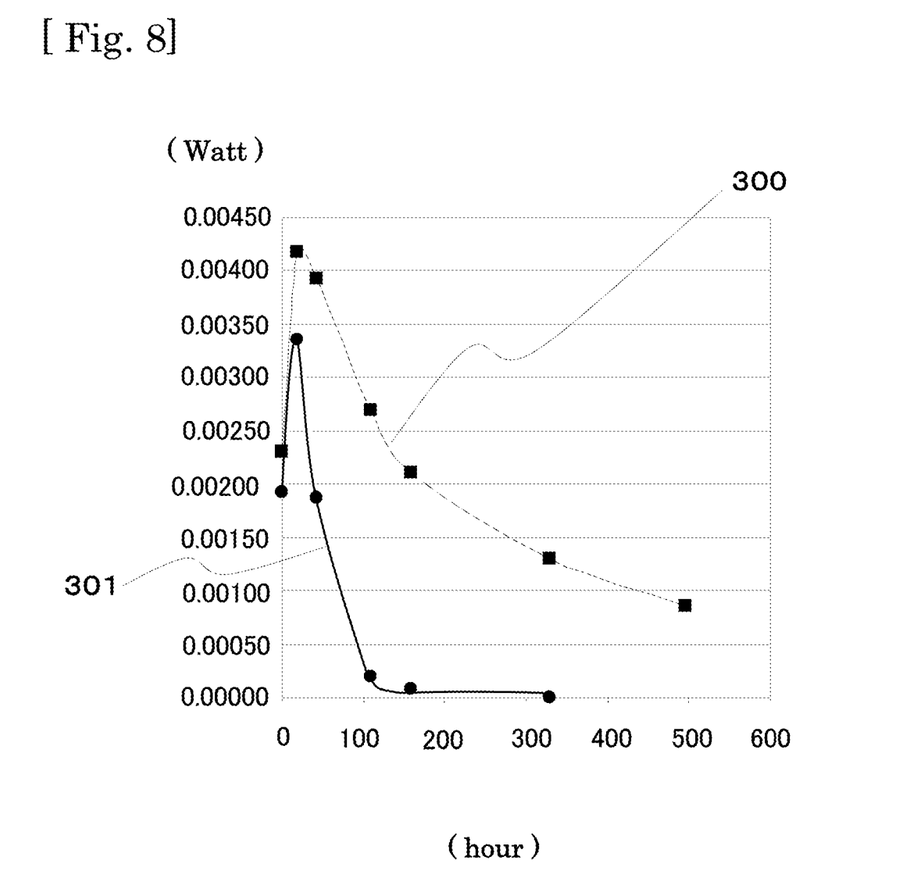
FIG. 8 A graph showing results of a luminescence lifetime test.

FIG. 8 is a graph showing results of a luminescence lifetime measurement test.

To investigate the luminescence lifetimes of the respective LED light emitting devices, the luminescence lifetimes of the samples prepared as described above were measured. Each LED light emitting device was placed inside an endurance testing machine (Cool Thermo Unit CTU-N manufactured by TAITEC CORPORATION) set to 60° C. Each LED light emitting device was taken out and the emission intensity was measured with a total luminous flux measurement system (manufactured by Otsuka Electronics Co., Ltd.) at predetermined time intervals. This test was conducted by the same method as the above-described (2) luminescence lifetime measuring method.

In the graph shown in FIG. 8, the horizontal axis shows the elapsed time (hour) from the start of the test, and the vertical axis shows the emission energy output (Watt) emitted by the device. In FIG. 8, the graphic curve 300 is of the LED light emitting device 8 (with ZnS particles) according to the fourth embodiment, and the graphic curve 301 is of the LED light emitting device 9 (without ZnS particles) as a comparative example.

As shown in FIG. 8, with the LED light emitting device 8 (with ZnS particles), even after 500 hours elapsed from the start of the test, light with energy intensity of a predetermined value or more could be confirmed. On the other hand, with the LED light emitting device 9 (without ZnS particles), a significant decrease in energy intensity was observed after the start, and after 100 hours elapsed from the start of the test, only low energy intensity was observed.

FIG. 8 shows the results that the LED device including the ZnS particles 102 had a longer luminescence lifetime.

As described above, in the LED light emitting device to which the present invention is applied, by providing a sealing layer with a moisture-proof property on a sealing layer that protects the semiconductor light emitting element, entrance of moisture that causes defects on the surfaces of the semiconductor quantum dots can be reduced.

In addition, by including ZnS particles in the sealing layer, dissolution or decomposition of ZnS of the shell portions of the semiconductor quantum dots due to moisture can be reduced. That is, due to the existence of surplus ZnS particles, elution of ZnS of the shell portions can be suppressed. As a result, the lifetime of the device can be lengthened. In addition, the luminescence efficiency of the device can be kept high.

As described above, a light emitting device utilizing a semiconductor to which the present invention is applied has sufficient luminescence efficiency, and is capable of stably emitting light for a long time.

DESCRIPTION OF SYMBOLS

1: LED light emitting device
10: Package
200: Semiconductor light emitting element
101: Semiconductor quantum dots 70: Silicone resin
201: Power supply terminal
305: Graphic curve (temperature: 60° C. without humidification)
306: Graphic curve (temperature: 60° C., humidity: 90)
5: LED light emitting device (first embodiment)
50: First sealing layer
60: Second sealing layer
6: LED light emitting device (second embodiment)
102: ZnS particles
7: LED light emitting device (third embodiment)
302: Graphic curve (without ZnS particles)
303: Graphic curve (with ZnS particles in the second sealing layer)
304: Graphic curve (with ZnS particles in the first sealing layer)
8: LED light emitting device (fourth embodiment)
80: Sealing layer

The invention claimed is:

1. A light emitting device utilizing a semiconductor, comprising:
a base substrate provided with a circuit pattern;
a light emitting element provided on the base substrate and electrically connected to the circuit pattern;
a first layer sealing portion which is formed on at least a part of the light emitting element and has semiconductor quantum dot particles and through which light emitted from the light emitting element is transmittable; and
a second layer sealing portion which is formed on at least a part of the first layer sealing portion, and has a moisture-proof property,
wherein
the semiconductor quantum dot particles comprise a core-shell structure with a semiconductor core and a protective shell having at least two layers, wherein at least one of the layers is a zinc sulfide shell,
the first layer sealing portion and the second layer sealing portion are made of a resin, and at least one of the first layer sealing portion and the second layer sealing portion includes zinc sulfide particles, and
particle diameters of the zinc sulfide particles are smaller than particle diameters of the semiconductor quantum dot particles, and a median value of the particle diameters of the zinc sulfide particles is 20 nm or less.

2. The light emitting device utilizing a semiconductor according to claim 1, wherein
the zinc sulfide particles have a weight ratio of 0.1 to 2% in a mixed state with the resin in the sealing portion including the zinc sulfide particles.

3. The light emitting device utilizing a semiconductor according to claim 2, wherein
the zinc sulfide particles have a weight ratio of approximately 0.5% in a mixed state with the resin in the sealing portion including the zinc sulfide particles.

4. The light emitting device utilizing a semiconductor according to claim 3, wherein
the first layer sealing portion includes zinc sulfide particles.

5. The light emitting device utilizing a semiconductor according to claim 4, wherein
the second layer sealing portion is made of an epoxy resin or a silicone resin.

6. The light emitting device utilizing a semiconductor according to claim 3, wherein
the second layer sealing portion is made of an epoxy resin or a silicone resin.

7. The light emitting device utilizing a semiconductor according to claim 2, wherein
the first layer sealing portion includes zinc sulfide particles.

8. The light emitting device utilizing a semiconductor according to claim 7, wherein
the second layer sealing portion is made of an epoxy resin or a silicone resin.

9. The light emitting device utilizing a semiconductor according to claim 2, wherein
the second layer sealing portion is made of an epoxy resin or a silicone resin.

10. The light emitting device utilizing a semiconductor according to claim 1, wherein
the first layer sealing portion includes zinc sulfide particles.

11. The light emitting device utilizing a semiconductor according to claim 10, wherein
the second layer sealing portion is made of an epoxy resin or a silicone resin.

12. The light emitting device utilizing a semiconductor according to claim 1, wherein
the second layer sealing portion is made of an epoxy resin or a silicone resin.

13. A light emitting device utilizing a semiconductor, comprising:
a base substrate provided with a circuit pattern;
a light emitting element provided on the base substrate and electrically connected to the circuit pattern; and
a sealing portion which is formed on at least a part of the light emitting element and has semiconductor quantum dot particles and zinc sulfide particles, and through which light emitted from the light emitting element is transmittable, wherein
the semiconductor quantum dot particles comprise a core-shell structure with a semiconductor core and a protective shell having at least two layers, wherein at least one of the layers is a zinc sulfide shell,
particle diameters of the zinc sulfide particles are smaller than particle diameters of the semiconductor quantum dot particles, and a median value of the particle diameters of the zinc sulfide particles is 20 nm or less.

* * * * *